US012549155B2

(12) United States Patent
Ochiai

(10) Patent No.: US 12,549,155 B2
(45) Date of Patent: Feb. 10, 2026

(54) FILTER MODULE FOR MULTIPLE CARRIER AGGREGATION WITH GROUND PLANE

(71) Applicant: Skyworks Solutions, Inc., Irvine, CA (US)

(72) Inventor: Akira Ochiai, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 373 days.

(21) Appl. No.: 18/095,458

(22) Filed: Jan. 10, 2023

(65) Prior Publication Data

US 2023/0223928 A1 Jul. 13, 2023

Related U.S. Application Data

(60) Provisional application No. 63/298,555, filed on Jan. 11, 2022.

(51) Int. Cl.
*H03H 9/60* (2006.01)
*H03H 9/205* (2006.01)
*H04B 1/40* (2015.01)

(52) U.S. Cl.
CPC ............ *H03H 9/605* (2013.01); *H03H 9/205* (2013.01); *H04B 1/40* (2013.01)

(58) Field of Classification Search
CPC ........ H03H 7/0115; H03H 3/00; H03H 7/461; H03H 7/463; H03H 2210/012; H03H 2210/025; H03H 2210/04; H03H 7/09; H03H 7/1775; H03H 7/465; H03H 9/205; H03H 9/605

USPC .......................................................... 455/73
See application file for complete search history.

(56) References Cited

U.S. PATENT DOCUMENTS

| | | |
|---|---|---|
| 2005/0212383 A1 | 9/2005 | Nakamura et al. |
| 2011/0084378 A1 | 4/2011 | Welch et al. |
| 2013/0335288 A1 | 12/2013 | Read et al. |
| 2014/0030852 A1 | 1/2014 | Welch et al. |
| 2014/0062620 A1* | 3/2014 | Sun ........................ H01P 11/003 333/205 |
| 2014/0167232 A1 | 6/2014 | LoBianco et al. |
| 2014/0167877 A1 | 6/2014 | Shimizu et al. |
| 2014/0307394 A1 | 10/2014 | LoBianco et al. |
| 2014/0308907 A1 | 10/2014 | Chen |
| 2014/0353807 A1 | 12/2014 | Welch et al. |

(Continued)

*Primary Examiner* — Ajibola A Akinyemi
(74) *Attorney, Agent, or Firm* — Knobbe, Martens, Olson & Bear, LLP

(57) ABSTRACT

A filter module for multiple carrier aggregation is provided which includes: a substrate having a first side and a second side, a plurality of filters disposed on the first side, a plurality of signal terminals disposed on the second side, each selectively connected to at least one of the plurality of filters and a ground plane disposed on the second side, wherein the ground plane is arranged to substantially surround each signal terminal on the second side and a method of improving cross isolation in a multiple carrier aggregation filter module, where the filter module includes a plurality of filters disposed on a first side of a substrate and a plurality of signal terminals on a second side of a substrate, and where the method includes disposing a ground plane on the second side wherein the ground plane is arranged to substantially surround each signal terminal on the second side.

18 Claims, 16 Drawing Sheets

(56) References Cited

U.S. PATENT DOCUMENTS

| | | |
|---|---|---|
| 2015/0126134 A1 | 5/2015 | LoBianco et al. |
| 2015/0137335 A1 | 5/2015 | Roy et al. |
| 2016/0049374 A1 | 2/2016 | LoBianco et al. |
| 2016/0071811 A1 | 3/2016 | Fuh et al. |
| 2016/0181206 A1 | 6/2016 | Read et al. |
| 2016/0248390 A1* | 8/2016 | Issakov ............... H03F 3/3001 |
| 2017/0070248 A1* | 3/2017 | Hwang ............... H04B 1/0057 |
| 2017/0149466 A1 | 5/2017 | LoBianco et al. |
| 2017/0301629 A1 | 10/2017 | Read et al. |
| 2017/0324160 A1 | 11/2017 | Khoury |
| 2018/0076148 A1 | 3/2018 | Nguyen et al. |
| 2018/0146541 A1 | 5/2018 | Chen |
| 2018/0337458 A1 | 11/2018 | Rodriguez et al. |
| 2018/0342469 A1 | 11/2018 | Fuh et al. |
| 2019/0057929 A1 | 2/2019 | Chen et al. |
| 2019/0139923 A1 | 5/2019 | Roy et al. |
| 2019/0198451 A1 | 6/2019 | Read et al. |
| 2019/0334237 A1 | 10/2019 | Khoury |
| 2020/0161222 A1 | 5/2020 | Chen et al. |
| 2020/0161254 A1 | 5/2020 | Chen |
| 2020/0227372 A1 | 7/2020 | Roy et al. |
| 2020/0403601 A1 | 12/2020 | Komatsu et al. |
| 2021/0105004 A1 | 4/2021 | Komatsu et al. |
| 2021/0273326 A1 | 9/2021 | Khoury |
| 2022/0182084 A1 | 6/2022 | King et al. |
| 2022/0182085 A1 | 6/2022 | King et al. |
| 2022/0255574 A1 | 8/2022 | Harrison |
| 2022/0310530 A1 | 9/2022 | LoBianco et al. |
| 2022/0336380 A1 | 10/2022 | Fuh et al. |
| 2023/0057627 A1 | 2/2023 | Macfarlane et al. |
| 2023/0088469 A1 | 3/2023 | Raghavan |
| 2023/0111462 A1 | 4/2023 | Khoury |
| 2023/0147252 A1 | 5/2023 | Sun et al. |

* cited by examiner

FILTER MODULE FOR MULTIPLE CARRIER AGGREGATION WITH GROUND PLANE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the disclosure relate to filter modules for multiple carrier aggregation (CA), and in particular to miniature filter modules with sufficient cross isolation between CA filter bands.

Description of the Related Technology

In filter modules supporting a number of filters, each supporting a particular filter band, there is a desire both for reduced size, such that an increased number of filter bands can be supported on a particular filter module, and for increased separation between each band such that interference between filter bands can be reduced or eliminated. This separation, or cross isolation (XISO) can be achieved conventionally by modifying each filter.

Where each filter is constructed from a number of individual resonators, connected to define the appropriate filter pass band, a sharper rejection for out of band signals can be provided by increasing the number of resonators. This allows for a more defined band pass, and prevents out of band signals from being passed by a particular filter. However, increasing the number of resonators also increases the size of the filters, and thus reduces the number of filters which can be incorporated on a filter module.

SUMMARY

According to one embodiment there is provided a filter module for multiple carrier aggregation, comprising: a substrate having a first side and a second side, a plurality of filters disposed on the first side, a plurality of signal terminals disposed on the second side, each selectively connected to at least one of the plurality of filters and a ground plane disposed on the second side, wherein the ground plane is arranged to substantially surround each signal terminal on the second side.

According to a further embodiment a method of improving cross isolation in a multiple carrier aggregation filter module is provided, the filter module comprising a plurality of filters disposed on a first side of a substrate and a plurality of signal terminals on a second side of a substrate, the method comprising disposing a ground plane on the second side wherein the ground plane is arranged to substantially surround each signal terminal on the second side.

In one example the ground plane substantially covers the area of substrate second side not covered by the plurality of signal terminals.

The provision of a ground plane on the underside of a filter module allows for greater cross isolation and improved coupling between the first and second filters. This means that the filters themselves can have the same number of, or fewer, resonators and more filters can be included in a filter module. Conversely, the filter module can be made smaller compared to a conventional filter module having the same number of filters, because there is no need to squeeze take up space in each filter with further resonators.

In one example the filter module further comprises at least one ground terminal disposed on the ground plane.

The provision of a ground terminal on the filter module allows for the ground plane to be connected into a circuit. It is possible to extend the ground plane beyond the filter module, or to connect the ground plane to the ground plane or ground terminal of another module.

In one example the edge of the ground plane follows the edge of the substrate and the plurality of signal terminals.

In one example in the first and second sides have opposing edges, the signal terminals are formed as one or more regions of conductive material extending from the edges of the second side towards a central region of the second side, the ground plane covers the central region and the periphery of the ground plane extends to the edges of the second side in between the signal terminals.

In one example there is a gap between the electrically conductive material of the plurality of signal terminals and the electrically conductive material of the ground plane, the gap providing a uniform spacing between the ground plane and the plurality of signal terminals.

The size of the ground plane should generally be maximized to achieve the benefits of the disclosure, however by providing a gap around each signal terminal, as well as the edge of the substrate, it is possible to achieve electrical isolation between the signal terminals and the ground plane, wherever electrical isolation is needed.

In one example, the first filter of the plurality of filters is configured to pass a first LTE band and a second filter of the plurality of filters is configured to pass a second LTE band.

By providing multiple filters which pass different LTE bands more LTE bands can be processed by the filter module. It is noted that the invention as a whole can also reduce cross isolation between filters which pass the same band, if they are required to be isolated. However, the utility of the filter module can be increased be providing filters with two different pass bands, tuned to two different LTE bands.

In one example the first LTE band has a neighboring frequency to the second LTE band.

In one example the first LTE band is band 30 and has a frequency of 2305 to 2360 MHz and wherein the second LTE band is band 7 and has a frequency of 2500 to 2690 MHz.

The claimed invention, by providing the ground plane which improves cross isolation allows for LTE bands of close frequencies to be provided on the same filter module, because the separation between the filter bands, and the out of band rejection, is improved.

In one example a third filter of the plurality of filters is configured to pass a third LTE band In one example the third LTE band has a neighboring frequency to the first or second LTE band.

In one example the third LTE band is band 53 and has a frequency of 2483 to 2495 MHz.

The benefits of having a third filter module having a third LTE band in a neighboring frequency are to increase the utility of the filter module.

In one example a fourth filter of the plurality of filter is configured to pass a fourth LTE band.

In one example the fourth LTE band has a neighboring frequency to the first, second or third LTE band.

In one example the fourth LTE band is band 66 and has a frequency of 1710 to 2200 MHz.

Similarly to the above third filter, a further filter further increases the utility of the filter module.

In some examples, the ground plane and/or the signal terminals may be made of metal, and in more specific examples, may be made from copper.

Metal is an ideal conductor of electrical signals and can be formed by surface etching of a prefabricated PCB material, comprising a layer of metal on either side of a plastic or dielectric substrate. The metal can be any ideal conductor, such as copper, gold, platinum, or any other known to one skilled in the art. It may be preferable to use copper as it is a good conductor with a relatively low cost and ease of etching.

In one example at least one of the filters comprises at least one acoustic wave resonator. Acoustic wave resonators, such as SAW or BAW resonators are useful for filtering signals, as they use mechanical properties of a substrate to provide a filtering action, which allows for an essentially analog filtering process which in turn allows high selectivity and low distortion. Additionally they are low cost and highly compact.

In one example at least one of the filters comprises a plurality of acoustic wave resonators arranged in a cascade.

By providing multiple resonators on one filter, the filter can be more selectively tuned to provide a useful filtered output with good out of band rejection. Furthermore, multiple notches and band passes can be provided in one filter.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to a filter module having a plurality of filters for filtering or passing a signal corresponding to at least one LTE band. When constructing a filter module it is desired to reduce the size of the filter module, or include more filters on the filter module. This is contrary to the requirement to maintain separation between signals passed by each filter, which requires an increased number of components composing the filter or a greater separation between filters. The reduction in size of the filter module can however be achieved whilst maintaining or improving signal separation by providing a ground plane on the underside of the filter module.

Figure 1:
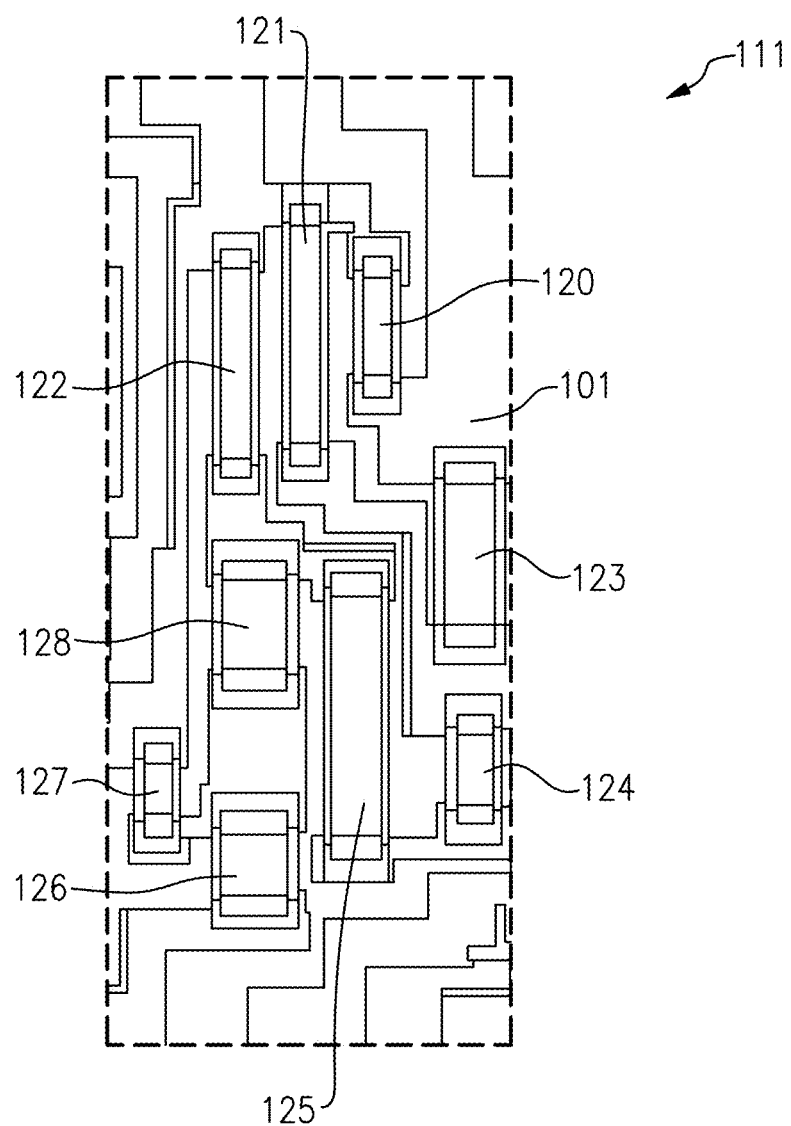
FIG. 1 shows an example filter layout

FIG. 1 shows an example filter 111 for implementation on a prior art filter module. Each filter is formed from a number of individual components, such as acoustic wave resonators. These resonators are set out with reference to the filter 111, as components 120, 121, 122, 123, 124, 125, 126 and 127. Each filter can have as many as 8 or more individual resonators.

The individual resonators 120 to 127 and their connections are arranged in a specific manner which requires substantial planning and design to arrange on the substrate 111. For instance one resonator, e.g. 120 may pass all of the signal of LTE band 55, but may have a large area outside of the LTE band which is also passed due to the nature of the resonator. To deal with this, it may be necessary to connect a further resonator, e.g. 121 in parallel or series which clips this out of band area to reduce the out of band signal. This resonator, however, may have a lower signal pass value, i.e. it may only pass signals up to 20 dB, whereas it is necessary for the filter 111 as a whole to pass larger signals. A further resonator can then be connected to increase the size of the signal passed. It can be seen that the layout of the resonators is complex and can make adding further resonators difficult.

Each of these resonators takes up space on the substrate 101, and as can be seen, each of the resonators is a different size and shape, and so their arrangement on the substrate 101 is a non-trivial matter. Further still, each resonator is connected to at least one other resonator in either a series, shunt or parallel configuration, adding yet more complexity to the substrate and taking up yet more room. The different configurations of resonators in each filter provide a challenge to making any changes to the filter layouts on the substrate 101. For instance, each filter can have any possible arrangements of connections between filters, depending on the required pass band.

The filter 111 shown in FIG. 1 is a specific example filter which can be implemented in a filter module to be used in any number of devices to carry out multiple carrier aggregation (CA) filtering. The size of devices which may use the multiple CA filter module often needs to be reduced, or the space available in the device for the filter module needs to be reduced. However, as can be seen, the filter 111 is populated almost to capacity.

The example filter is implemented on a filter module, as set out above. Once the filters are arranged on the substrate 101 in such a compact manner, interference between the filters is increased. As each filter, for example, filter 111, has a number of components, e.g. 120, 121, which rely on the use of acoustic propagation to filter signals, physical proximity of the individual filters can cause interference. Furthermore, this interference is increased when the filters are dealing with signals with similar passbands.

For instance, in the specific example, filter 111 is configured to pass an LTE band 53 signal, which operates at an uplink frequency of 2483.5-2495 MHz. A further filter on the filter module may be configured to pass an LTE band 7 signal, which operates at 2500 to 2570 MHz. It can be seen therefore that the pass bands for each filter are separated only by 5 Mhz, and are in relative terms, very close to each other.

In some instances, more than a pair of filters are provided on the filter module. A third filter may be configured to pass an LTE band 30 having an uplink frequency 2305 to 2315 MHz, which while further apart is still relatively close to the pass bands of the pair of filters. These bands can be considered to neighbor one another, and are at risk of interference.

A fourth filter may be configured to pass an LTE band 66 having a frequency range of 1710 to 2200 MHz, which is close to at least the pass band on the first filter. The fourth filter is configured to output an LTE band 25 signal, which has a pass band of 1850 to 1995, which directly overlaps the second filter. The specific arrangement of filters and their passbands is not limited to this example, and the filters may pass other bands or the same bands but through different filters.

One means of preventing interference, is to "clip" the pass bands of the filters, such that the out of band rejection is high. That is to say that very little or no signal is passed by each filter which is strictly outside its designated pass band. This means that there are no signals passed by incorrect filters, i.e. filter 111 does not pass the 2500 MHz signal the other filter on the substrate.

To achieve this clipping, it is possible to add more resonators to each filter module. However, as discussed above, there is little space on the substrate 101 for further resonators, and it can be the case that adding further resonators compounds the issue of space. It is therefore a non-trivial exercise to miniaturize and locate resonators and filters on the substrate 101.

The substrate 101 contains a number of connections which facilitate connection between the resonators and the substrate to create the filter 111. The connections are formed by etching the substrate. Furthermore, there are etches, not shown, on the reverse of the substrate, which facilitate connection of the filter module to a wider circuit or set of components.

Not shown in FIG. 1 is a ground plane disposed on the back of the substrate 101. In conventional filter modules a ground connection is often provided on the reverse of the filter module, however the plane is shaped and sized in a "functional manner", that is no more material is used than necessary to connect the ground connections together. If there is only one ground connection, a small patch may be provided, and if there are two, they may be connected by a small trace.

Figure 2:
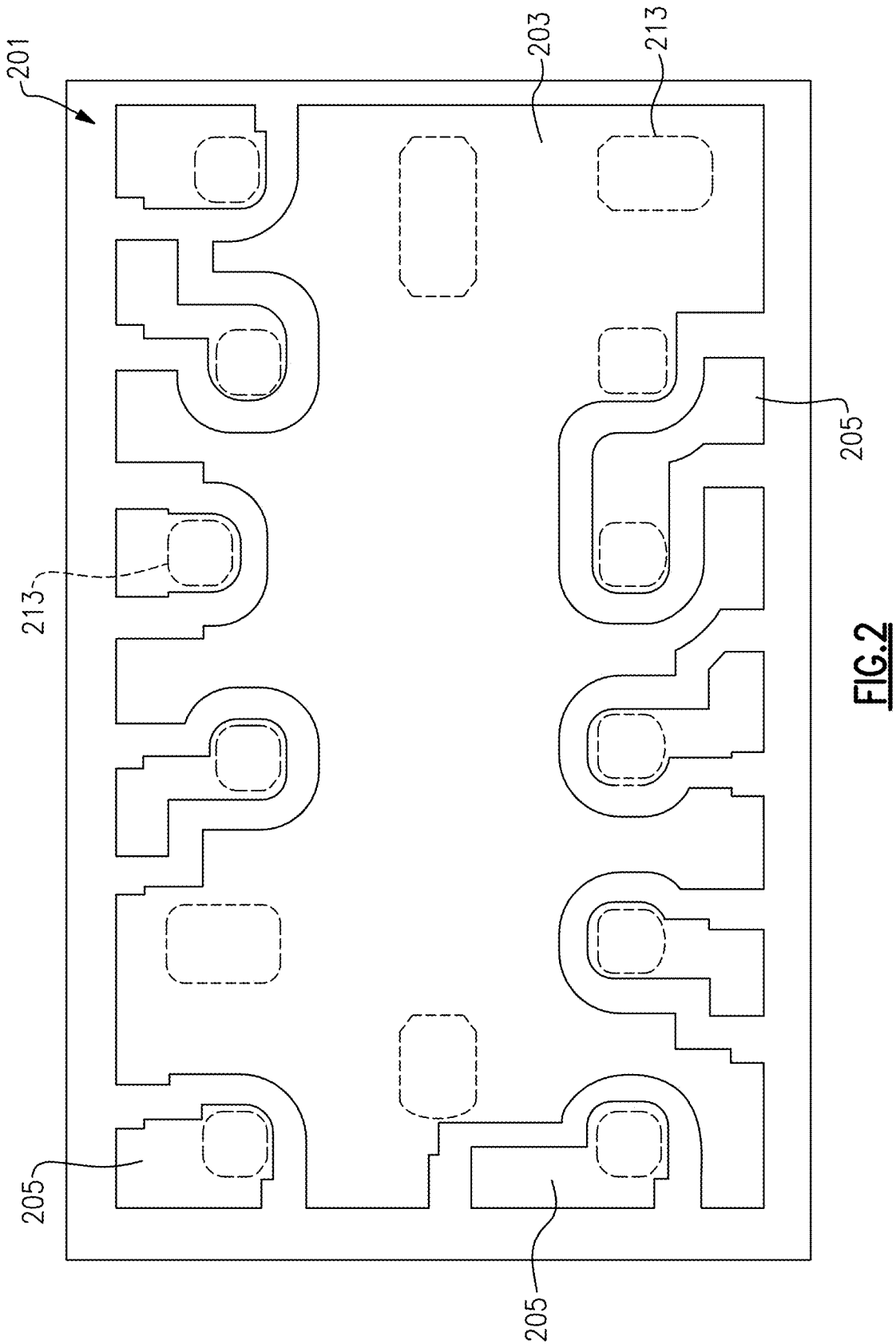
FIG. 2 shows an example filter module according to a specific implementation of the present disclosure.

In the improved filter module, which is better shown in FIG. 2, the ground plane is instead sized such that it covers substantially all of the reverse of substrate, leaving only small areas around the terminal connections provided on the reverse of the substrate. The ground plane is made of copper, etched onto the substrate, however it can be made of any suitable metal.

By providing this ground plane, the cross isolation between the filters is increased. This means that the filters are substantially more isolated from one another than without the ground plane, and that coupling is improved in the sense that where lower coupling is to be desired, this is achieved.

The filter 111 can be used in any number of devices. In other examples, the filter module may have different layouts, however, elegantly the introduction of the ground plane can solve separation problems on any real world example with no real limit on the exact positioning of any filters on the substrate filter module.

The reverse of a filter module is shown in FIG. 2. The filter module 200 has a number of signal terminals 205 etched onto the reverse of the substrate 201. In this example, the signal terminals 205 reflect inputs for LTE band 7, 30 and 55 filters, as well as band 25 and 70 outputs, along with outputs for the band 7, 30 and 55 filters, as well as a band 66 output.

The specific bands reflect the example shown herein, however other filter modules may use different bands and may have different arrangements of inputs and outputs.

Disposed on the reverse of the substrate 201 is a ground plane 203. It can be seen that the ground plane extends to substantially surround each connection point 205, such that a locus drawn incorporating the edge of the substrate 201 and the perimeter of each connection point 205 describes the perimeter of the ground plane. In other embodiments, the ground plane may have a different shape, but should generally follow this geometric pattern with respect to the substrate 201 and the signal terminals 205.

The dotted areas 213 show corresponding filter connection points on the top side of the substrate 201. In some instances, these extend through the substrate to connect the top side and bottom side of the substrate in particular locations.

To illustrate the general principle, an abstraction is set out with reference to the figures below, where the components are shown in general terms as simple rectangles, so that the various configurations of filters and ground planes can be more readily understood.

Figure 3:
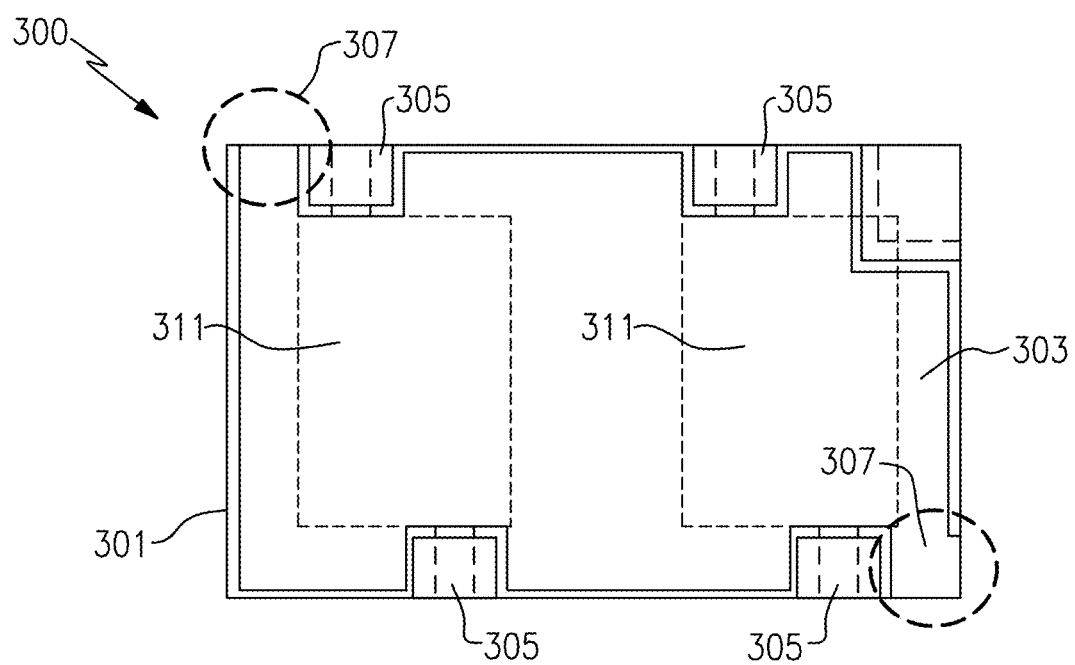
FIG. 3 shows an example filter module according to one aspect of the present invention.

FIG. 3 shows an example filter module 300, where the reverse side of the substrate 301 (the non-filter side) is shown. Signal terminals 305 are shown, and the ground plane 303 is shown as substantially covering the substrate 301 at points where there is no connection point 305. To illustrate the top side of the substrate 301, the filters and traces are shown in dashed lines 311. Signal terminals of the ground plane 305 are shown in circles 307. It can be seen that the most efficient route between the two ground connections 307 would be a diagonal or stepped trace linking the two.

However, to achieve the benefits of improved cross isolation and coupling between filters, the ground plane 303 instead covers the entirety of the substrate 301, leaving only a gap for electrical isolation from the signal terminals 305.

In FIG. 3 it can be seen that the substrate has opposing edges, and the signal terminals are formed as regions of conductive material extending from the edges of the second side towards a central region of the underside of the substrate, and the ground plane covers the central region and its periphery extends to the edges of the underside of the substrate in between the signal terminals. These opposing edges are also present on the top side of the substrate. Further, the substrate may only have one signal terminal on the underside.

Of the two filters shown as 311, the first filter is tuned to a particular LTE band, such as LTE band 30, which has a frequency of 2305 to 2360 MHz, and requires a filter tuned to this particular pass band. The second filter is also tuned to a particular LTE band such as band 7, which has a frequency of 2500 to 2690 MHz. It is important therefore that at least the rejection between 2360 MHz in band 30 and 2500 MHz in band 7 so that elements of the band 30 signal are not passed by the second filter. This is achieved by implementing the ground plane 303.

Figure 4:
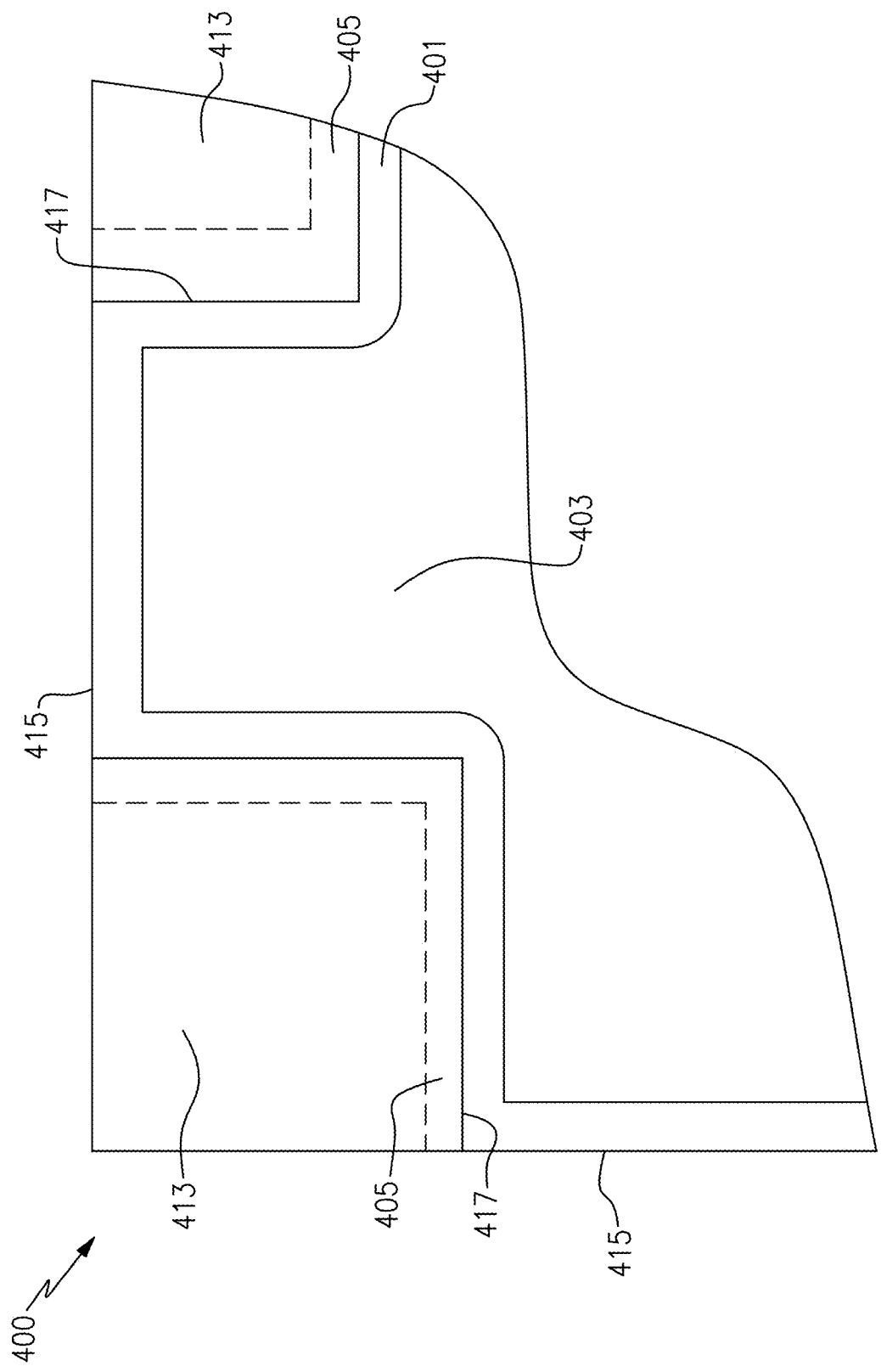
FIG. 4 shows a close up view of the filter module of FIG. 3.

The general form of the ground plane 303 and its relationship to the signal terminals 305 and substrate 301 edge is better shown in FIG. 4

In FIG. 4 top side traces are shown as 413. These are the connections on the filter side of the substrate 401 which essentially extends through the substrate 401 to provide a signal terminal 405 on the reverse of the substrate. By this, a connection can be made to the bottom side of the filter module 400, which connects in turn to the filters on the top side.

The edges of the signal terminals 405 are shown as lines 417, and the edges of the substrate 401 are shown as lines 415. These make the perimeter of the available space on the substrate 401. The ground plane 403 has a perimeter which describes a locus of the perimeter of the available space on the substrate 401. That is, a line drawn perpendicular to the substrate perimeter (or indeed ground plane perimeter) to the other is equidistant around the perimeter of the substrate 401 of ground plane 403.

This distance is helpful for electrical isolation of the ground plane 303 to the signal terminals 405. As it is not necessary to provide electrical isolation to the edge of the substrate 401, the ground plane 403 can extend all the way to the edge of the substrate 401, whilst still maintaining the gap around the signal terminals 405.

Figure 5A:
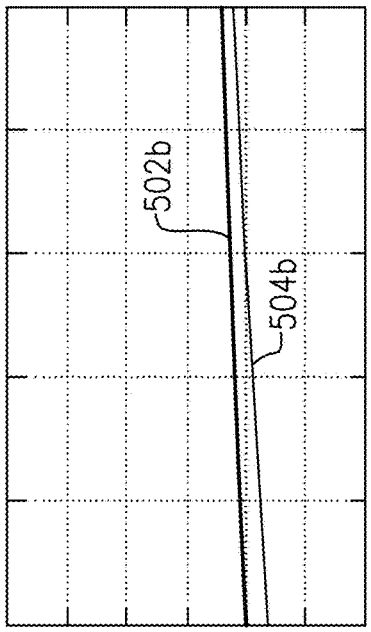
FIGS. 5A to 5R show an exemplary responses of filters implemented on the filter module of FIG. 4 compared to a filter implemented on a prior art filter module.
Figure 5B:
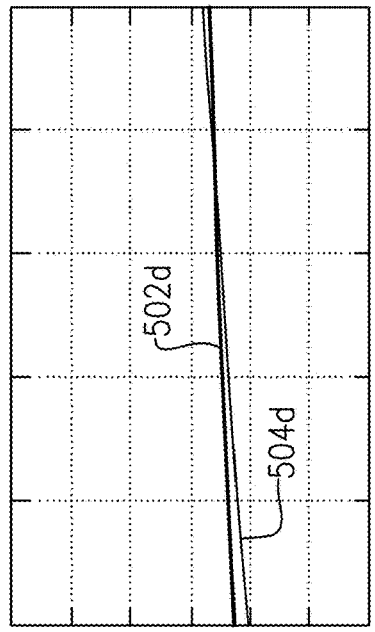
Figure 5C:
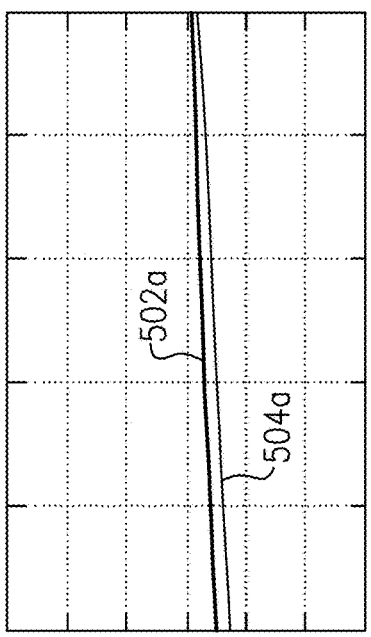
Figure 5D:
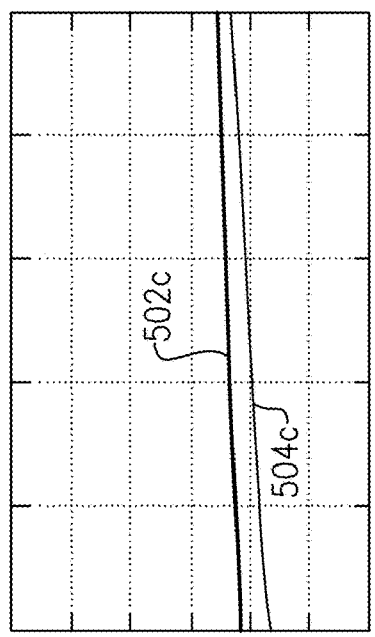
Figure 5E:
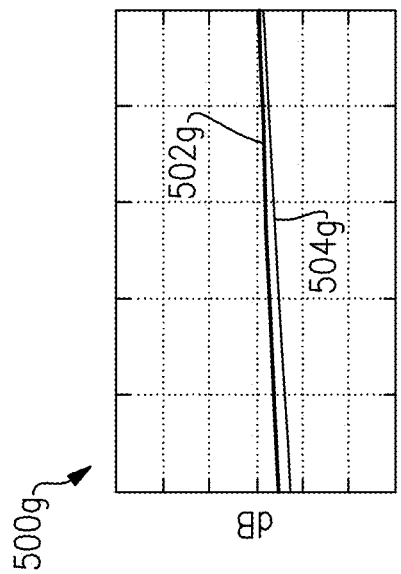
Figure 5H:
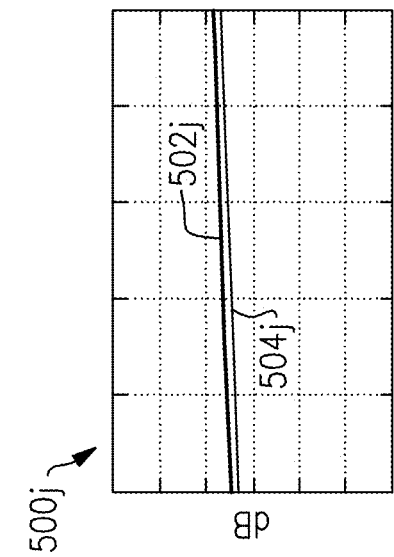
Figure 5F:
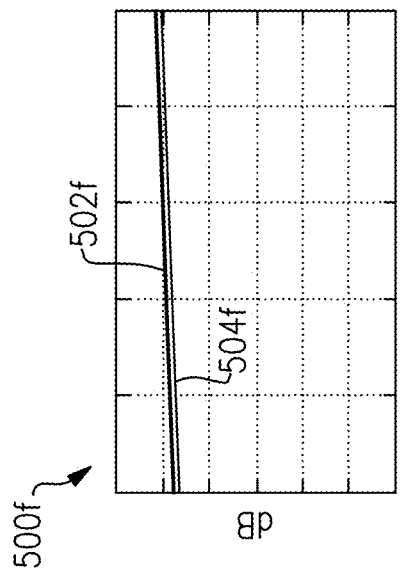
Figure 5I:
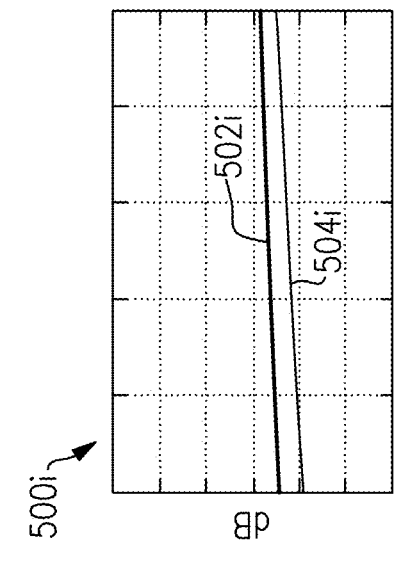
Figure 5G:
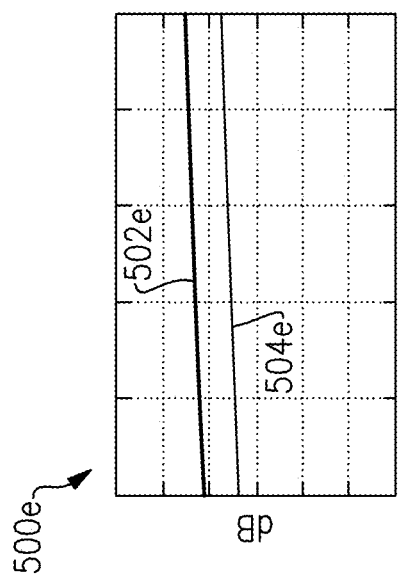
Figure 5J:
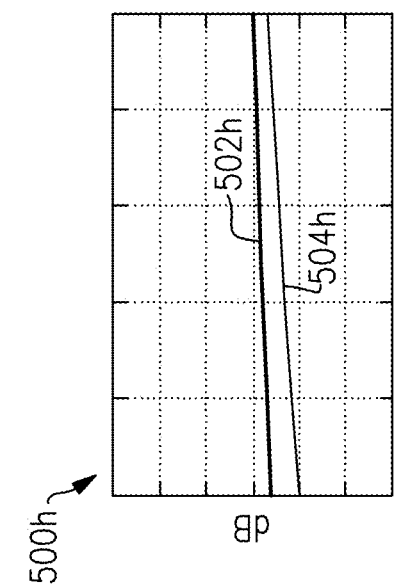
Figure 5L:
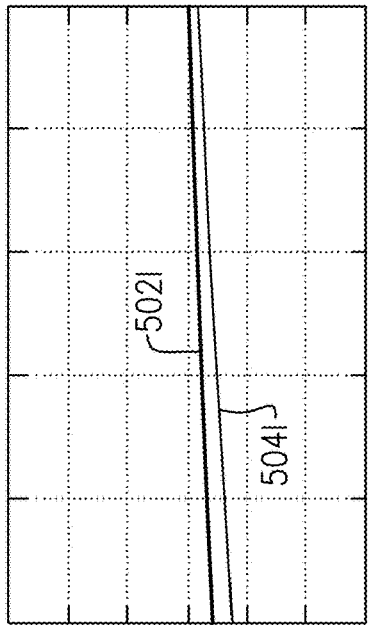
Figure 5N:
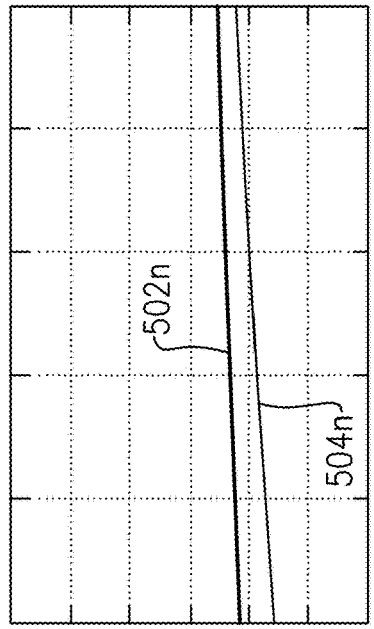
Figure 5K:
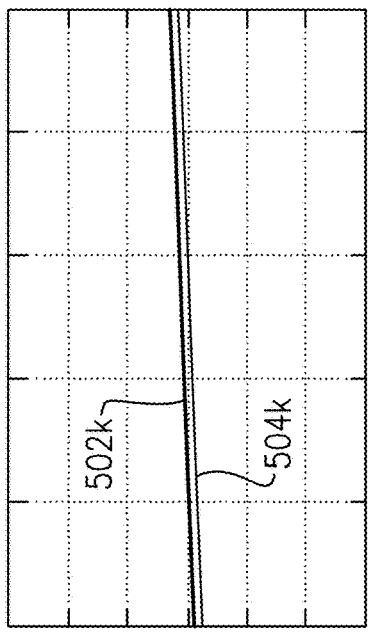
Figure 5M:
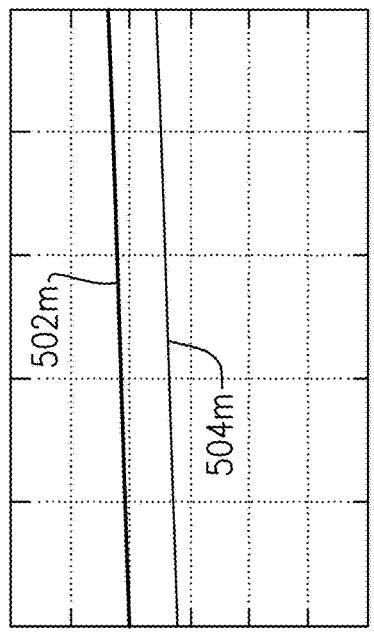
Figure 5O:
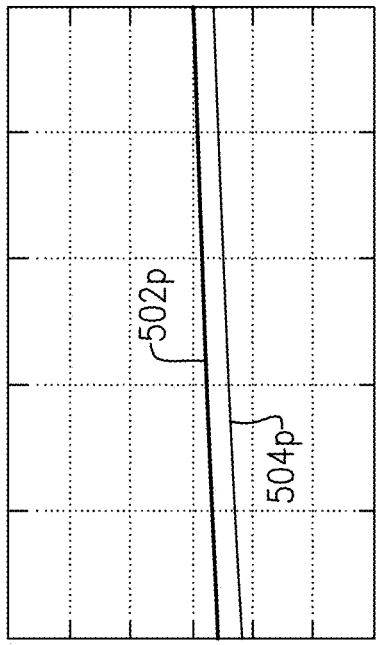
Figure 5Q:
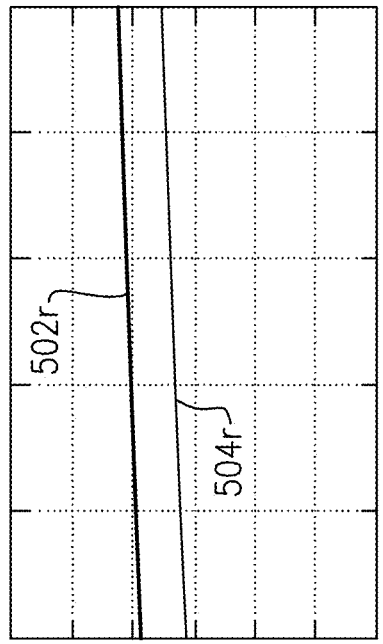
Figure 5P:
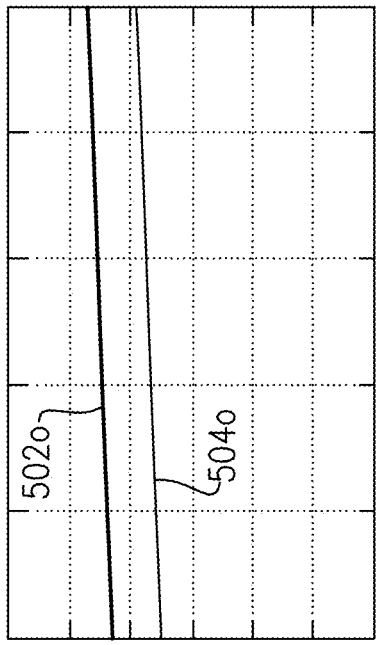
Figure 5R:
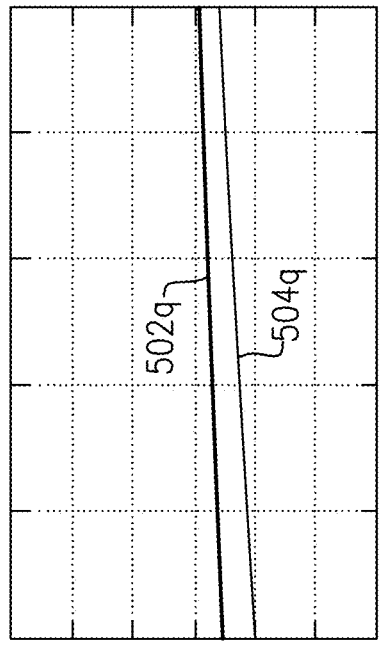

FIGS. 5A to 5R show that the cross isolation between each signal terminal, for example the signal terminals 205 of FIG. 2. The y axis shows the attenuation in decibels and the x axis shows the attenuation with respect to frequency.

Turning briefly to FIG. 2, and starting with the signal terminal in the top left corner and moving clockwise, in a specific example:

The top left signal terminal is an LTE band 53 input, (B53 IN), a ground terminal (GND), B7 IN, B30 IN, a common input (CMN IN), a combined band 25 and 70 output (B25/B70 OUT), GND, GND, B66 OUT, B30 OUT, B7 OUT, B53 OUT and GND.

FIG. 5A shows the cross isolation between the signal terminals B25/B70 OUT and B66 OUT. It can be seen that the signal 504a, representing the improved filter module 300 has a higher attenuation than the signal 502a, representing the prior art filter module without the ground plane 303. This represents improved cross isolation between those signal terminals. In all of the following examples, the line 502(b-r) represents a prior art filter module without the ground plane 303. The line 504(b-r) represents the improved filter 300.

FIG. 5B shows the cross isolation between the signal terminals B25/B70 OUT and B30 OUT. It can be seen that the line 504b (improved filter module) shows a higher attenuation than the line 502b (prior art).

FIG. 5C shows the cross isolation between the signal terminals CMN IN and B30 OUT. It can be seen that the line 504c (improved filter module) shows a higher attenuation than the line 502c (prior art).

FIG. 5D shows the cross isolation between the signal terminals B7 IN and B66 OUT. It can be seen that the line 504d (improved filter module) shows a higher attenuation than the line 502d (prior art).

FIG. 5E shows the cross isolation between the signal terminals B66 OUT and B30 OUT. It can be seen that the line 504e (improved filter module) shows a higher attenuation than the line 502e (prior art).

FIG. 5F shows the cross isolation between the signal terminals CMN IN and B25/B70 OUT. It can be seen that the line 504f (improved filter module) shows a higher attenuation than the line 502f (prior art).

FIG. 5G shows the cross isolation between the signal terminals CMN IN and B66 OUT. It can be seen that the line 504g (improved filter module) shows a higher attenuation than the line 502g (prior art).

FIG. 5H shows the cross isolation between the signal terminals B7 OUT and B66 OUT. It can be seen that the line 504h (improved filter module) shows a higher attenuation than the line 502h (prior art).

FIG. 5i shows the cross isolation between the signal terminals B7 IN and B7 OUT. It can be seen that the line 504i (improved filter module) shows a higher attenuation than the line 502i (prior art).

FIG. 5J shows the cross isolation between the signal terminals B53 IN and B53 OUT. It can be seen that the line 504j (improved filter module) shows a higher attenuation than the line 502j (prior art).

FIG. 5K shows the cross isolation between the signal terminals B7 IN and B53 IN. It can be seen that the line 504k (improved filter module) shows a higher attenuation than the line 502k (prior art).

FIG. 5L shows the cross isolation between the signal terminals B7 IN and B53 OUT. It can be seen that the line 504l (improved filter module) shows a higher attenuation than the line 502l (prior art).

FIG. 5M shows the cross isolation between the signal terminals B30 OUT and B7 OUT. It can be seen that the line 504m (improved filter module) shows a higher attenuation than the line 502m (prior art).

FIG. 5N shows the cross isolation between the signal terminals B30 IN and B7 OUT. It can be seen that the line 504n (improved filter module) shows a higher attenuation than the line 502n (prior art).

FIG. 5O shows the cross isolation between the signal terminals B7 OUT and B53 OUT. It can be seen that the line 504o (improved filter module) shows a higher attenuation than the line 502o (prior art).

FIG. 5P shows the cross isolation between the signal terminals B53 IN and B7 OUT. It can be seen that the line 504p (improved filter module) shows a higher attenuation than the line 502p (prior art).

FIG. 5Q shows the cross isolation between the signal terminals B30 OUT and B7 IN. It can be seen that the line 504q (improved filter module) shows a higher attenuation than the line 502q (prior art).

FIG. 5R shows the cross isolation between the signal terminals B30 IN and B7 IN. It can be seen that the line 504r (improved filter module) shows a higher attenuation than the line 502r (prior art).

Figure 6:
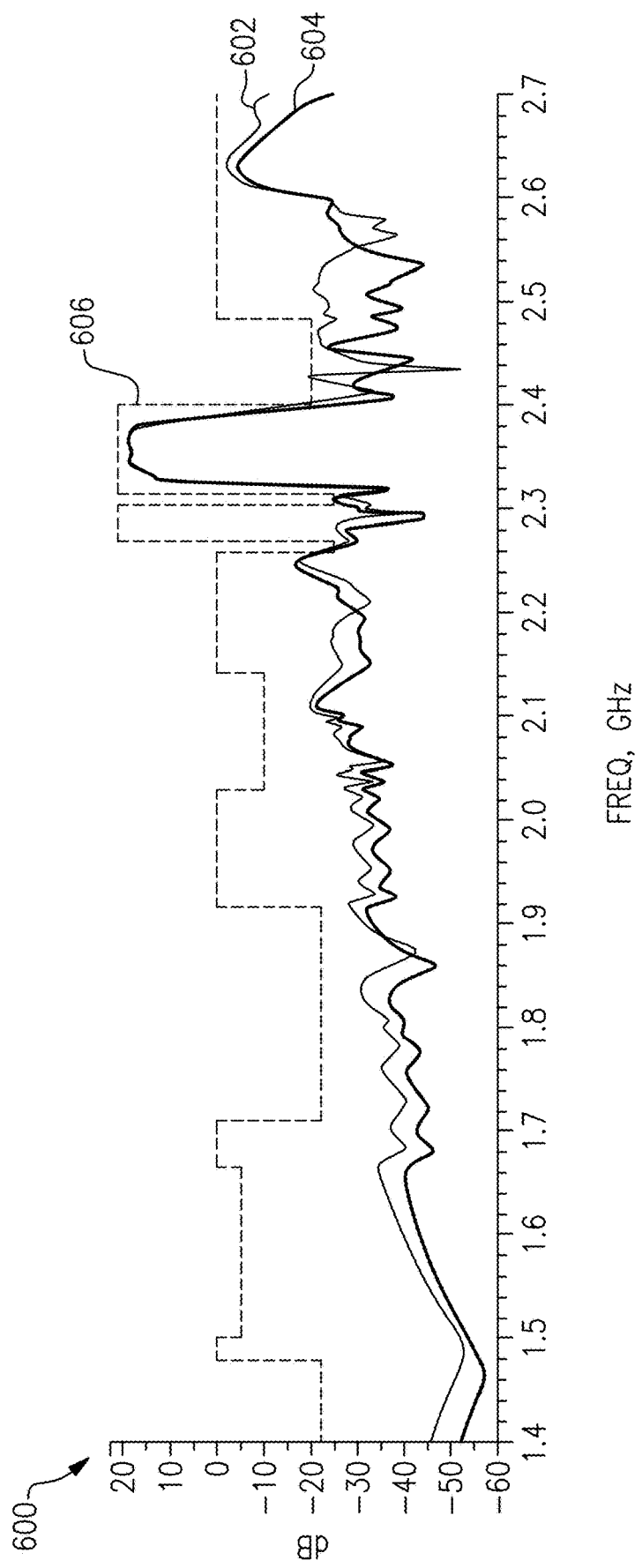
FIG. 6 shows an exemplary response of a filter implemented on the filter module of FIG. 3 compared to a filter implemented on a prior art filter module.

FIG. 6 shows a chart 600 illustrating the response of the filter 311 implemented on the filter module 300 of FIG. 3 compared to a filter implemented on a prior art filter module.

The response of the prior art filter is shown as plot 602 and the response of the filter 311 is shown as plot 604. The ideal passband for LTE band 30 is also shown as dotted line 606. The y axis shows the attenuation in decibels and the x axis shows the attenuation with respect to frequency.

It can be seen that the out of band rejection, i.e. the plot where the ideal passband dips below 0 dB, is both on average lower and also smoother in plot 604 than in plot 602. It can also be seen that the prior art plot, 602, touches the ideal passband at some locations to the left of the large spike. This means that that filter comes close to allowing a signal to pass outside the specified pass band. The plot representing the response from the filter 311 implemented on the filter module 300, does not come close to this band.

Figure 7:
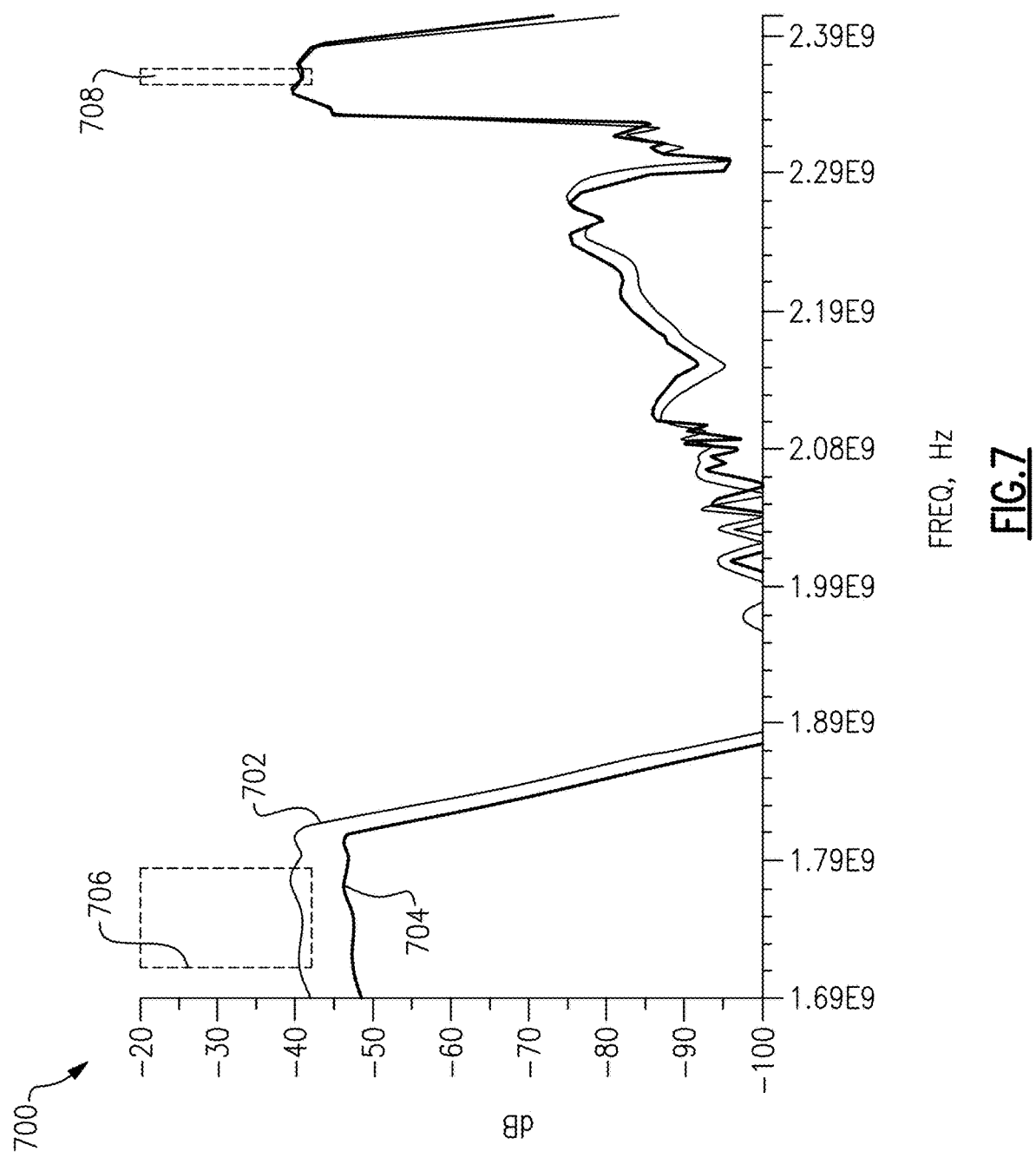
FIG. 7 shows an exemplary noise figure implemented on the filter module of FIG. 4 compared to a filter implemented on a prior art filter module.

FIG. 7 shows plot 700 illustrating an example attenuation of the B66 OUT signal terminal and the B30 IN terminal. The y axis shows the attenuation in decibels and the x axis shows the attenuation with respect to frequency. The cross isolation requirement of each signal is shown by the bottom lines of boxes 706 and 708. The bottom line of box 706 shows the required attenuation of a signal for the B66 OUT terminal, and the bottom line of box 708 shows the required attenuation of the signal for the B30 IN terminal. The response of the prior art filter module, not having the ground plane, is shown as plot 702. The improved filter module response is shown as plot 704. It can be seen, particularly at 706, that the attenuation is improved using the improved filter module. Attenuation is also improved, in this example to a lesser extent, at 708.

The plot 700 is exemplary, and as shown in FIGS. 5A to 5R, attenuation is improved across the entire range of LTE bands.

Figure 8:
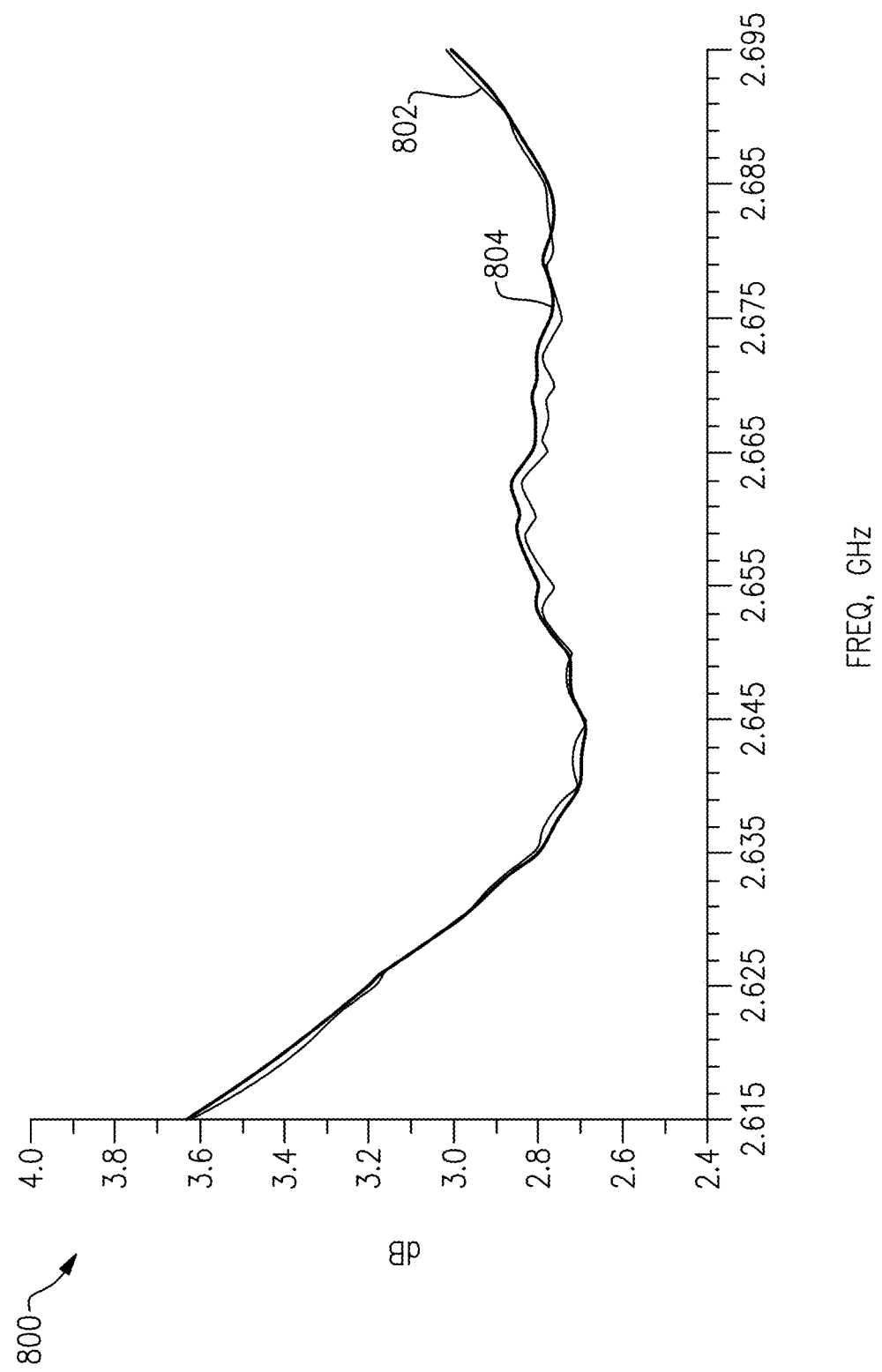
FIG. 8 shows an exemplary noise figure for a filter implemented on the filter module of FIG. 3 compared to a filter implemented on a prior art filter module.

FIG. 8 shows a chart 800 illustrating an example noise figure of a filter 311 implemented on the filter module 300. The y axis shows the attenuation in decibels and the x axis shows the attenuation with respect to frequency. In particular, the noise figure shown is for a filter configured to pass LTE band 7, however the overall improvement shown in the chart 800 is representative of an improvement generally achieved by any filter 311, when implemented on the filter module 300 using the ground plane 303.

The chart 800 shows a noise figure for a prior art filter module at line 802. The plot 804 shows a noise figure for a filter 311, in this example a band 7 filter having terminals B7 7 IN and OUT when implemented on the filter module 300 having the metallic ground plane 303. It can be seen that interference is reduced in the filter implemented on the improved filter module 300, as the noise FIG. 800 is visibly improved. The prior art plot 802 shows a large amount of ripple, which in this example is caused by coupling between the band 7 filter and a band 30 filter on the filter module. This coupling, or interference causes the a ripple in the prior art noise figure.

It can be seen however that by providing the ground plane 301 that this ripple is substantially reduced and as such the noise figure is greatly improved. The ripple removed from the noise figure of plot 804 shows that there is lower coupling between the two filters.

Figure 9:
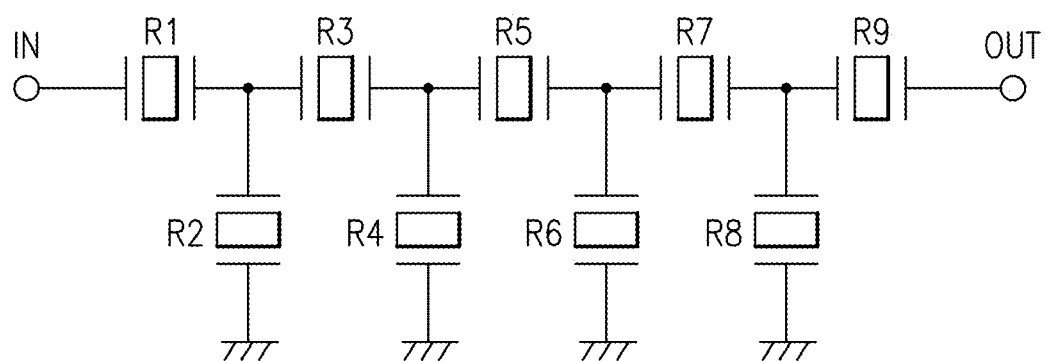
FIG. 9 shows an example filter such as the kind implemented on the filter module of FIG. 1.

FIG. 9 shows an example of a filter 900 in which multiple acoustic resonators may be combined. FIG. 9 shows an RF ladder filter 900 including a plurality of series acoustic resonators including the resonators R1, R3, R5, R7, and R9, and a plurality of parallel (or shunt) acoustic resonators R2, R4, R6, and R8. As shown, the plurality of series acoustic wave devices R1, R3, R5, R7, and R9 are connected in series between the input and the output of the RF ladder filter, and the plurality of parallel acoustic wave devices R2, R4, R6, and R8 are respectively connected between series acoustic wave devices and ground in a shunt configuration. Other filter structures and other circuit structures known in the art that may include acoustic resonators, for example, duplexers, multiplexors, switches, modulators, oscillators, etc., may also be formed and incorporated into the filter module 900.

Figure 10A:
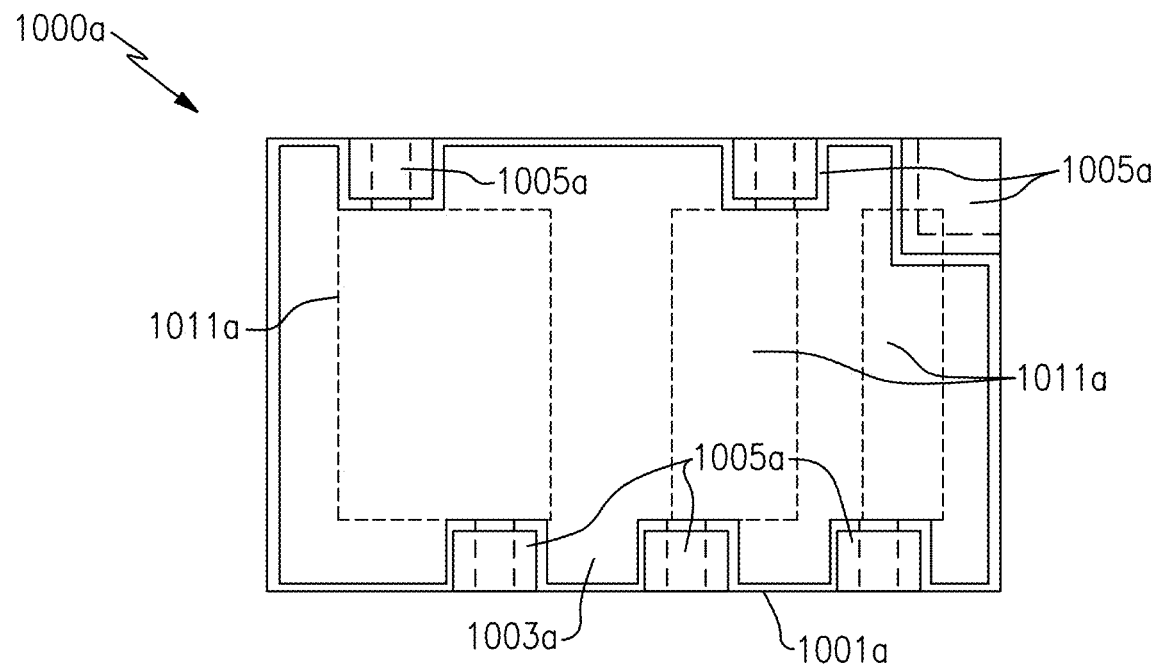
FIG. 10A shows an example filter module according to a further aspect of the present disclosure.

FIG. 10a shows a further exemplary filter module 1000a which has three filters 1011a disposed on the substrate 1001a top side. As there are more filters, more signal terminals 1005a are provided, however the format of the ground plane 1003a remains the same in that it occupies substantially the remainder of the available space on the substrate 1001a, whilst leaving a gap around the signal terminals to allow for electrical isolation between the filters 1011a and the ground plane 1003a.

The third filter is tuned to a particular LTE band, such as LTE band 53, which has a frequency of 2483.5 to 2495 MHz, and requires a filter tuned to this particular pass band. The ground plane helps to prevent interference between this filter and the two filters previously described, and therefore improves cross isolation and coupling between the filters.

Figure 10B:
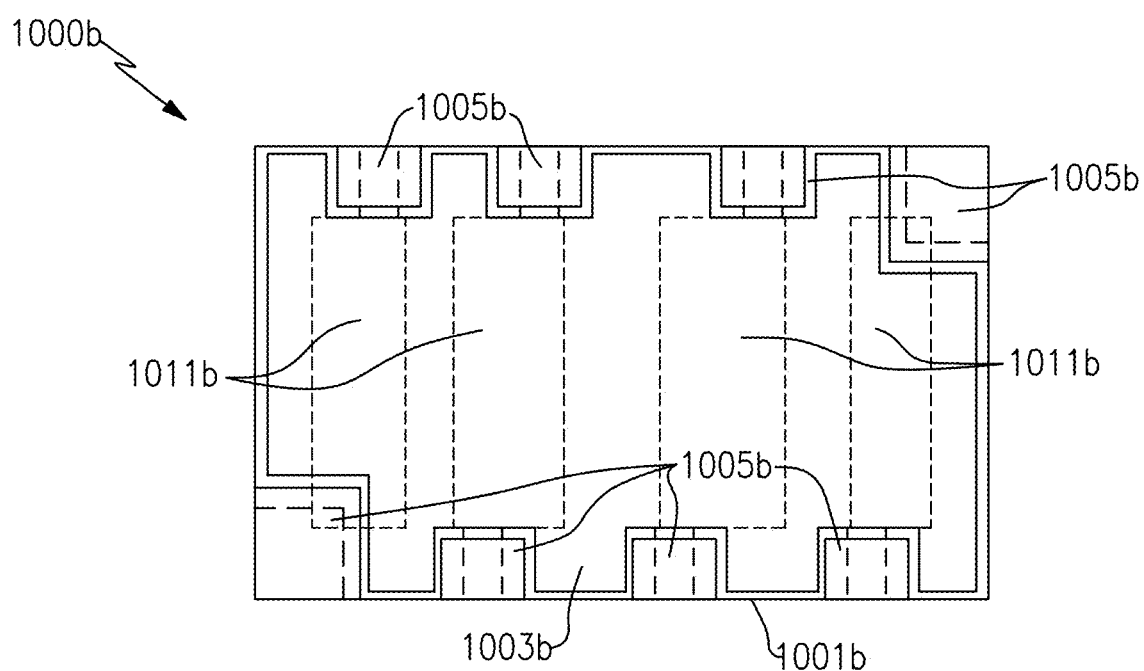
FIG. 10B shows an example filter module according to a further aspect of the present disclosure.

To further illustrate the versatility of the ground plane solution, FIG. 10b shows an example filter module 1000b with four filters 1011b, where the ground plane 1003b has the same relationship with the substrate 1001b and the signal terminals 1005b.

The fourth filter is also tuned to a particular LTE band such as band 66, which has a frequency of 1710 to 2200 to 2690 MHz. In both of these examples, the LTE bands are either close or nearly overlapping, and as such cross isolation is important between the filters. This is achieved by the ground plane 1003b (and indeed 1003a) in the manner described above.

Figure 11:
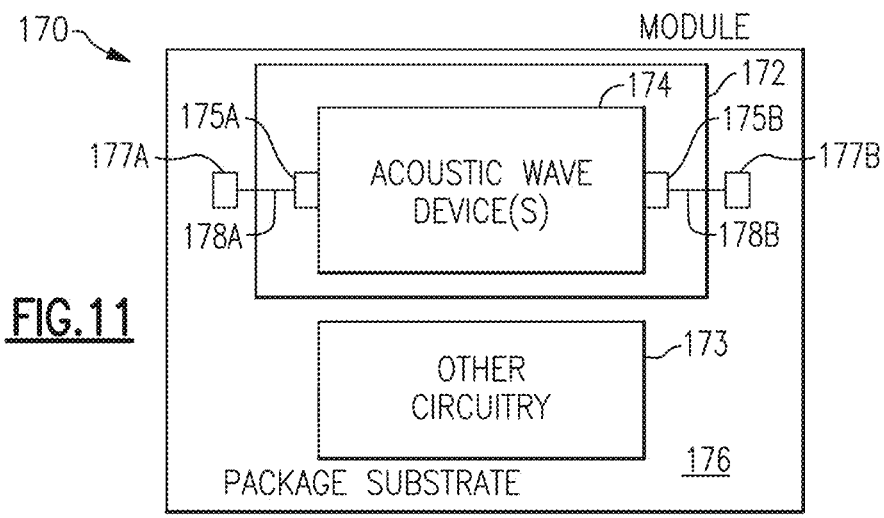
FIGS. 11, 12, and 13 are schematic block diagrams of illustrative devices and systems according to certain embodiments.
Figure 12:
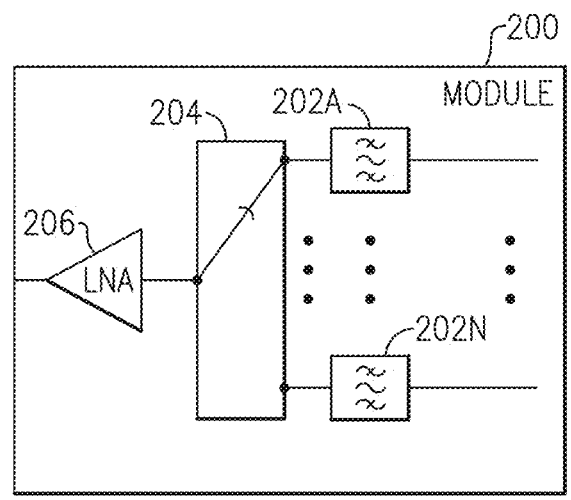
Figure 13:
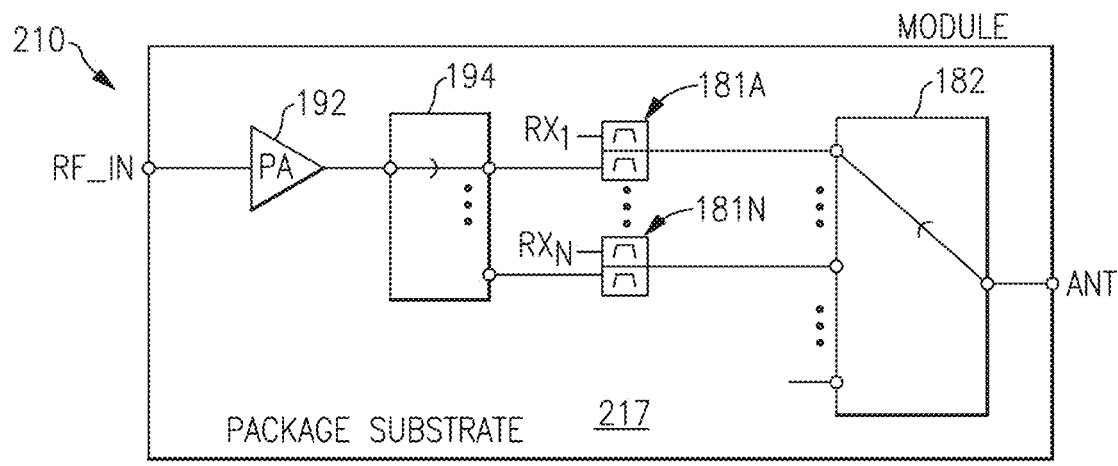

Some examples of devices and systems in which the filters and filter modules described herein can be implemented will now be disclosed. For example, FIGS. 11 to 13 show schematic block diagrams of illustrative devices and systems according to certain embodiments. Any suitable combination of these devices and systems can be implemented with each other.

FIG. 11 is a schematic diagram of a radio frequency module 170 that includes an acoustic wave component 172 according to an embodiment. The illustrated radio frequency module 170 includes the acoustic wave component 172 and other circuitry 173. For example, acoustic wave component 172 can include any of the filters or filter modules shown and described with respect to FIGS. 1-10B.

The acoustic wave component 172 shown in FIG. 11 includes acoustic wave devices 174 and terminals 175A and 175B. The acoustic wave devices 174 can implement acoustic wave filter(s) in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 11. The packaging substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. Accordingly, the other circuitry 173 can include one or more radio frequency circuit elements. The other circuitry 173 can be referred to as radio frequency circuitry in certain applications. The other circuitry 173 can be electrically connected to the acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

FIG. 12 is a schematic block diagram of a module 200 that includes filters 202A to 202N, a radio frequency switch 204, and a low noise amplifier 206 according to an embodiment. One or more filters of the filters 202A to 202N can be implemented in accordance with any suitable principles and advantages disclosed herein. For example, some or all of the filters 202A to 202N can include any of the filters or filter modules described herein with respect to FIGS. 1-10B. Any suitable number of filters 202A to 202N can be implemented. The illustrated filters 202A to 202N are receive filters. One or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments, a plurality of low noise amplifiers can be implemented. The module 200 can include diversity receive features in certain applications.

FIG. 13 is a schematic diagram of a radio frequency module 210 that includes an acoustic wave filter according to an embodiment. As illustrated, the radio frequency module 210 includes duplexers 181A to 181N, a power amplifier 192, a radio frequency switch 194 configured as a select switch, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier can be referred to as a power amplifier module. A radio frequency module can include a subset of the elements illustrated in FIG. 13 and/or additional elements. The radio frequency module 210 may include any one of the acoustic wave filters in accordance with any suitable principles and advantages disclosed herein, including any of the filters or filter modules shown and described with respect to FIGS. 1-10B.

The duplexers 181A to 181N can each include two acoustic wave filters coupled to a common node. The duplexers may include any one of the acoustic wave filters in accordance with any suitable principles and advantages disclosed herein, including any of the filters or filter modules shown and described with respect to FIGS. 1-10B. For example, the two acoustic wave filters can be a transmit filter and a receive filter. As illustrated, the transmit filter and the receive filter can each be a band pass filter arranged to filter a radio frequency signal. One or more of the transmit filters can be an acoustic wave device in accordance with any suitable principles and advantages disclosed herein. Similarly, one or more of the receive filters can be an acoustic wave device in accordance with any suitable principles and advantages disclosed herein. Although FIG. 13 illustrates duplexers, any suitable principles and advantages disclosed herein can be implemented in other multiplexers (e.g., quadplexers, hexaplexers, octoplexers, etc.) and/or in switched multiplexers and/or with standalone filters.

The power amplifier 192 can amplify a radio frequency signal. The illustrated radio frequency switch 194 is a multi-throw radio frequency switch. The radio frequency switch 194 can electrically couple an output of the power amplifier 192 to a selected transmit filter of the transmit filters of the duplexers 181A to 181N. In some instances, the radio frequency switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

Figure 14:
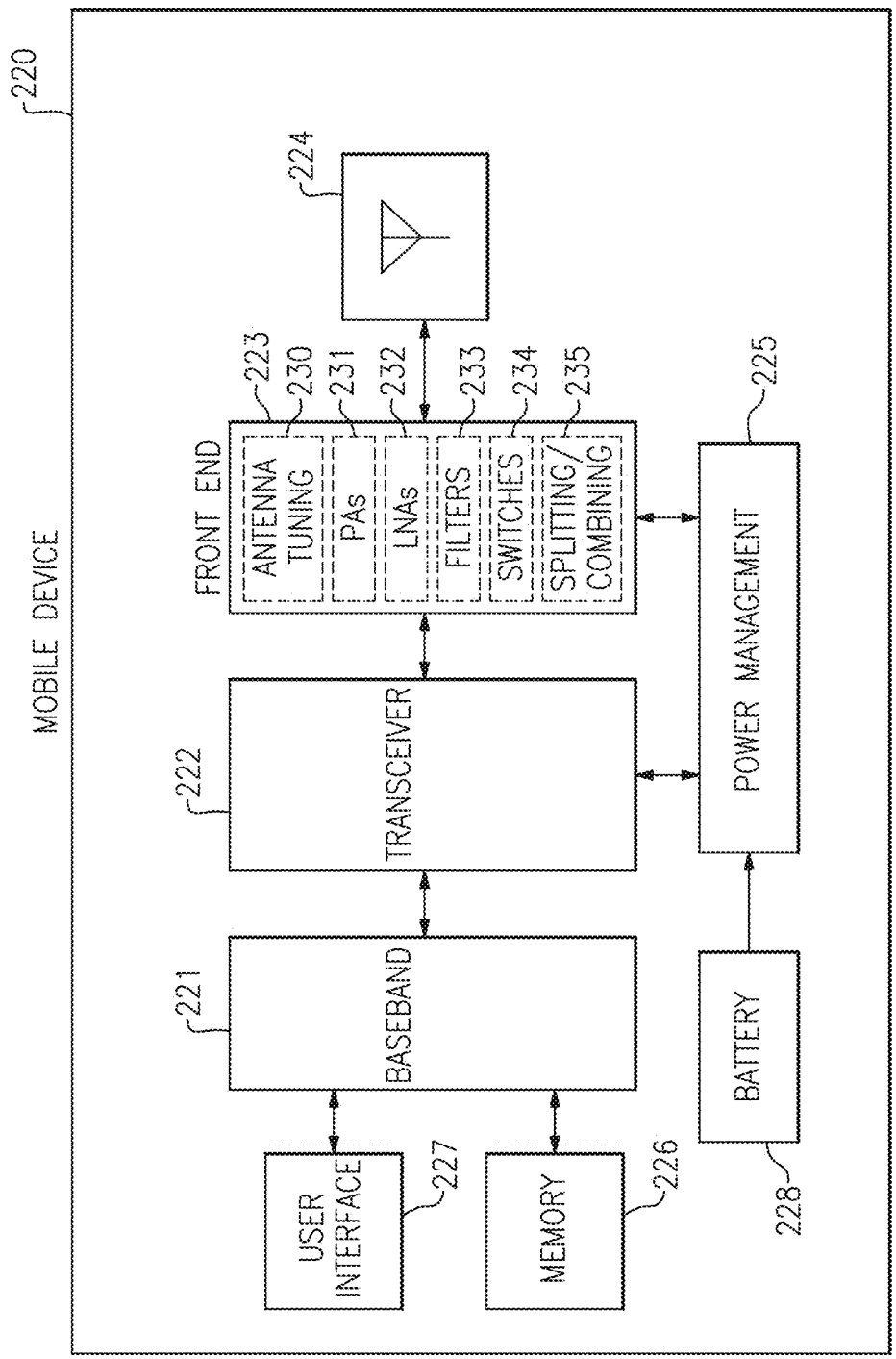
FIG. 14 is a schematic diagram of one embodiment of a mobile device.

The acoustic wave filters disclosed herein can be implemented in wireless communication devices. FIG. 14 is a schematic block diagram of a wireless communication device 220 that includes an acoustic wave filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 14 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more acoustic wave filters in accordance with any suitable principles and advantages disclosed herein, and may include any of the filters or filter modules shown and described with respect to FIGS. 1-10B.

The front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 14, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 14, the power management system 225 receives a battery voltage from the battery 228. The battery 228 can be any suitable battery for use in the wireless communication device 220, including, for example, a lithium-ion battery.

Technology disclosed herein can be implemented in acoustic wave filters in 5G applications. 5G technology is also referred to herein as 5G New Radio (NR). 5G NR supports and/or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR. An acoustic wave filter including any suitable combination of features disclosed herein can be arranged to filter a radio frequency signal in a 5G NR operating band within Frequency Range 1 (FR1). FR1 can be from 410 MHz to 7.125 GHz, for example, as specified in a current 5G NR specification. An acoustic wave filter in accordance with any suitable principles and advantages disclosed herein can be arranged to filter a radio frequency signal in a fourth generation (4G) Long Term Evolution (LTE). An acoustic wave filter in accordance with any suitable principles and advantages disclosed herein can have a pass band that includes a 4G LTE operating band and a 5G NR operating band. Such a filter can be implemented in a dual connectivity application, such as an E-UTRAN New Radio-Dual Connectivity (ENDC) application.

Acoustic wave filters disclosed herein can suppress H2. Such features can be advantageous in 5G NR applications. Suppressing H2 can provide increased filter linearity. Higher filter linearity can contribute to meeting stringent system level linearity specifications in certain 5G NR applications. With higher filter linearity, higher peak to average power ratios that are present in certain 5G NR applications can be accommodated. Suppression of H2 and/or higher filter linearity can be advantageous for meeting one or more other specifications in 5G technology.

Figure 15:
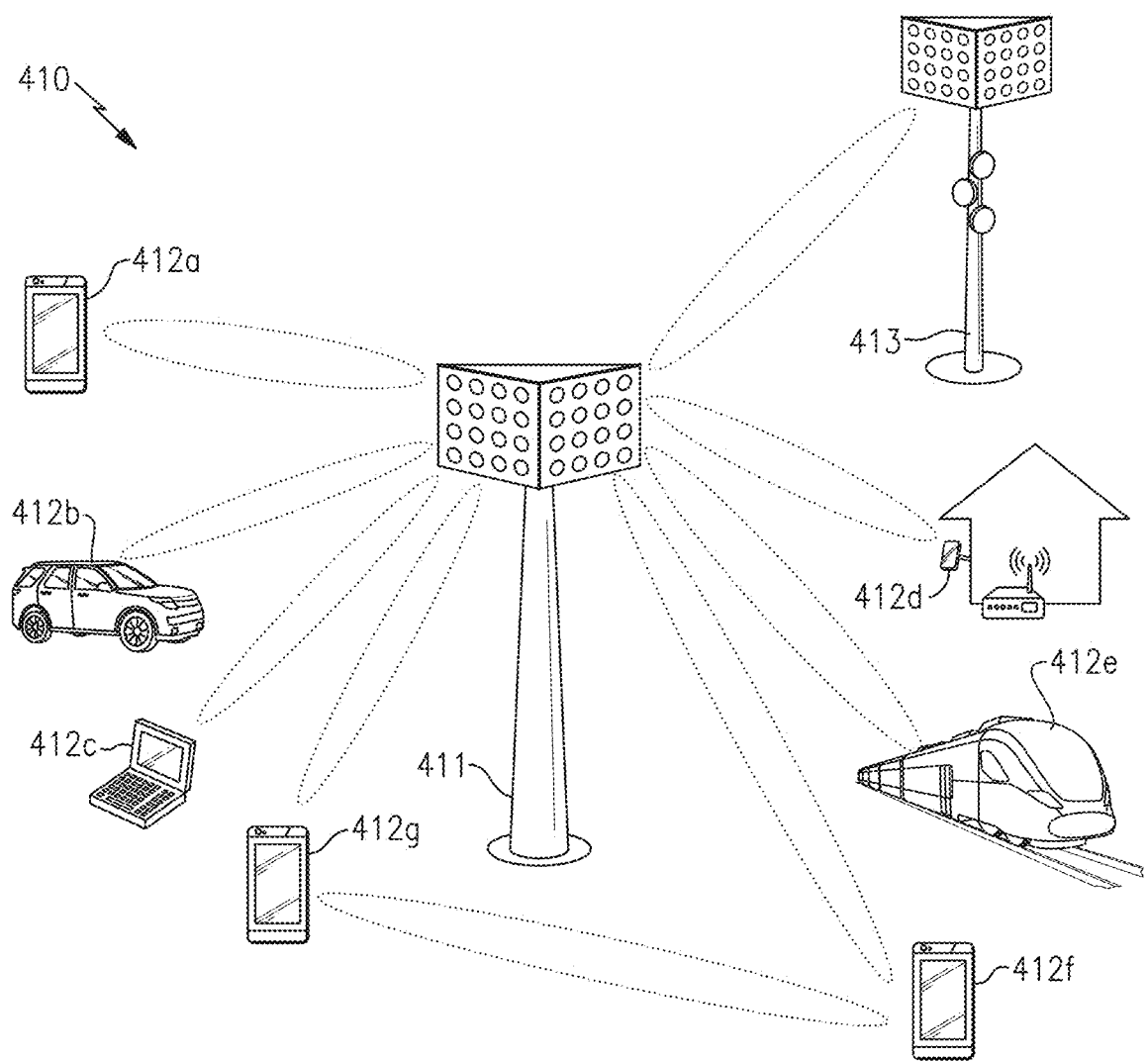
FIG. 15 is a schematic diagram of one example of a communication network.

FIG. 15 is a schematic diagram of one example of a communication network 410. The communication network 410 includes a macro cell base station 411, a small cell base station 413, and various examples of user equipment (UE), including a first mobile device 412a, a wireless-connected car 412b, a laptop 412c, a stationary wireless device 412d, a wireless-connected train 412e, a second mobile device 412f, and a third mobile device 412g. UEs are wireless communication devices. One or more of the macro cell base station 411, the small cell base station 413, or UEs illustrated in FIG. 15 can implement one or more of the acoustic wave filters in accordance with any suitable principles and advantages disclosed herein. For example, one or more of the UEs shown in FIG. 15 can include one or more acoustic wave filters in accordance with any suitable principles and advantages disclosed herein, and may include any of the filters or filter modules shown and described with respect to FIGS. 1-10B.

Although specific examples of base stations and user equipment are illustrated in FIG. 15, a communication network can include base stations and user equipment of a wide variety of types and/or numbers. For instance, in the example shown, the communication network 410 includes the macro cell base station 411 and the small cell base station 413. The small cell base station 413 can operate with relatively lower power, shorter range, and/or with fewer concurrent users relative to the macro cell base station 411. The small cell base station 413 can also be referred to as a femtocell, a picocell, or a microcell. Although the communication network 410 is illustrated as including two base stations, the communication network 410 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 410 of FIG. 15 supports communications using a variety of cellular technologies, including, for example, 4G LTE and 5G NR. In certain implementations, the communication network 410 is further adapted to provide a wireless local area network (WLAN), such as WiFi. Although various examples of communication technologies have been provided, the communication network 410 can be adapted to support a wide variety of communication technologies.

Various communication links of the communication network 410 have been depicted in FIG. 15. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 15, the communication links include not only communication links between UE and base stations, but also UE to UE communications and base station to base station communications. For example, the communication network 410 can be implemented to support self-fronthaul and/or self-backhaul (for instance, as between mobile device 412g and mobile device 412f).

The communication links can operate over a wide variety of frequencies. In certain implementations, communications are supported using 5G NR technology over one or more frequency bands that are less than 6 GHz and/or over one or more frequency bands that are greater than 6 GHz. According to certain implementations, the communication links can serve Frequency Range 1 (FR1), Frequency Range 2 (FR2), or a combination thereof. An acoustic wave filter in accordance with any suitable principles and advantages disclosed herein can filter a radio frequency signal within FR1. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 410 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 3 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 15 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 5 GHz, in a frequency range from about 400 MHz to 8.5 GHz or in FR1.

Whilst the examples above have been described with specific filters in mind, the general principle of the ground plane is applicable to any filter module, where it is necessary, or even desired to increase cross isolation and improve coupling between filters.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. A filter module for multiple carrier aggregation comprising:
a substrate having a first side and a second side opposite the first side;
a plurality of acoustic filters disposed on the first side;
a plurality of signal terminals disposed on the second side, each selectively connected to at least one of the plurality of acoustic filters, the first side and the second side having opposing edges, the plurality of signal terminals formed as one or more regions of electrically conductive material extending from at least two edges of the second side towards a central region of the second side; and
a ground plane disposed on the second side, the ground plane arranged to substantially surround each signal terminal on the second side, the ground plane covering the central region, and a periphery of the ground plane extending to the edges of the second side in between the plurality of signal terminals, a gap between the one or more regions of electrically conductive material of the plurality of signal terminals and electrically conductive material of the ground plane, the gap providing an electrically isolative spacing between the ground plane and the plurality of signal terminals.

2. The filter module of claim 1 wherein the ground plane substantially covers an area of the second side not covered by the plurality of signal terminals.

3. The filter module of claim 1 further comprising at least one ground terminal disposed on the ground plane.

4. The filter module of claim 3 wherein an edge of the ground plane follows an edge of the substrate and the plurality of signal terminals.

5. The filter module of claim 1 wherein, the gap provides a uniform spacing between the ground plane and the plurality of signal terminals.

6. The filter module of claim 1 wherein a first filter of the plurality of acoustic filters is configured to pass a first LTE band and a second filter of the plurality of acoustic filters is configured to pass a second LTE band.

7. The filter module of claim 6 wherein the first LTE band has a neighboring frequency to the second LTE band.

8. The filter module of claim 6 wherein the first LTE band is band 30 and has a frequency of 2305 to 2360 MHz and the second LTE band is band 7 and has a frequency of 2500 to 2690 MHz.

9. The filter module of claim 1 wherein at least one of the plurality of acoustic filters includes at least one acoustic wave resonator.

10. The filter module of claim 9 wherein the at least one acoustic wave resonator is a surface acoustic wave resonator or a bulk acoustic wave resonator.

11. The filter module of claim 9 wherein at least one of the plurality of acoustic filters includes a plurality of acoustic wave resonators arranged in a cascade.

12. A mobile device comprising:
an antenna;
a transceiver;
a filter module coupled between the antenna and the transceiver and including a substrate having a first side and a second side opposite the first side, a plurality of acoustic filters disposed on the first side, a plurality of signal terminals disposed on the second side, each selectively connected to at least one of the plurality of acoustic filters, the first side and the second side having opposing edges, the plurality of signal terminals formed as one or more regions of electrically conductive material extending from at least two edges of the second side towards a central region of the second side, and a ground plane disposed on the second side, the ground plane arranged to substantially surround each signal terminal on the second side, the ground plane covering the central region, and a periphery of the ground plane extending to the edges of the second side in between the plurality of signal terminals, a gap between the one or more regions of electrically conductive material of the plurality of signal terminals and electrically conductive material of the ground plane, the gap providing an electrically isolative spacing between the ground plane and the plurality of signal terminals.

13. The mobile device of claim 12 wherein the ground plane substantially covers an area of the second side not covered by the plurality of signal terminals.

14. The mobile device of claim 12 further comprising at least one ground terminal disposed on the ground plane.

15. The mobile device of claim 14 wherein an edge of the ground plane follows an edge of the substrate and the plurality of signal terminals.

16. The mobile device of claim 12 wherein the gap provides a uniform spacing between the ground plane and the plurality of signal terminals.

17. The filter module of claim 12 wherein a first filter of the plurality of acoustic filters is configured to pass a first LTE band and a second filter of the plurality of acoustic filters is configured to pass a second LTE band.

18. A method of improving cross isolation in a multiple carrier aggregation filter module, the multiple carrier aggregation filter module including a plurality of acoustic filters disposed on a first side of a substrate and a plurality of signal terminals on a second side of a substrate opposite the first side, the first side and the second side having opposing edges, the plurality of signal terminals formed as one or more regions of electrically conductive material extending from at least two edges of the second side towards a central region of the second side, the method including disposing a ground plane on the second side, the ground plane arranged to substantially surround each signal terminal on the second side, the ground plane covering the central region, and a periphery of the ground plane extending to the edges of the second side in between the plurality of signal terminals, a gap between the one or more regions of electrically conductive material of the plurality of signal terminals and electrically conductive material of the ground plane, the gap providing an electrically isolative spacing between the ground plane and the plurality of signal terminals.

* * * * *